United States Patent [19]

Brady et al.

[11] Patent Number: 5,281,447
[45] Date of Patent: Jan. 25, 1994

[54] PATTERNED DEPOSITION OF METALS VIA PHOTOCHEMICAL DECOMPOSITION OF METAL-OXALATE COMPLEXES

[75] Inventors: Michael J. Brady, Brewster; Stephen L. Buchwalter, Wappingers Falls; Richard J. Gambino, Yorktown Heights; Martin J. Goldberg, Mahopac; Kam L. Lee, Putnam Valley; Alfred Viehbeck, Stormville, all of N.Y.

[73] Assignee: International Business Machines Corporation, Armonk, N.Y.

[21] Appl. No.: 783,054

[22] Filed: Oct. 25, 1991

[51] Int. Cl.$^5$ .................. B05D 3/06; B05D 5/12
[52] U.S. Cl. .................. 427/555; 427/554; 427/553; 427/597; 427/596; 427/595; 427/96; 427/97; 427/98; 427/123; 427/125; 427/62; 427/437; 427/443.1; 427/405; 205/125
[58] Field of Search .......... 427/555, 554, 597, 596, 427/595, 96, 97, 98, 62, 63, 123, 125, 553, 443.1, 437, 405; 205/125

[56] References Cited

U.S. PATENT DOCUMENTS

| | | |
|---|---|---|
| 3,099,608 | 7/1963 | Radovsky et al. |
| 3,303,111 | 2/1967 | Peach . |
| 3,930,963 | 1/1976 | Polichette et al. .......... 427/97 |
| 3,937,857 | 2/1976 | Brummett .......... 427/98 |
| 4,536,421 | 8/1985 | Matsuzawa et al. .......... 427/282 |
| 4,683,036 | 7/1987 | Morrissey et al. . |
| 4,853,252 | 8/1989 | Fränkel et al. .......... 427/53.1 |
| 4,976,990 | 12/1990 | Bach et al. .......... 427/98 |

FOREIGN PATENT DOCUMENTS 1222969 2/1971 United Kingdom .

OTHER PUBLICATIONS

Nakao et al., "Magnetron Sputtering of Bi-Ca-Sr-Cn-O Thin Films With Superconductivity above 80K", *Japanese Journal of Applied Physics*, vol. 27, No. 3, Mar. 1988, pp. L378-L380.
Liu et al., "Epitaxial Growth of High-$T_c$ Bi-Ca-Sr-Cu-O Superconducting Layer by LPE Process", *Japanese Journal of Applied Physics*, vol. 27, No. 8, Aug. 1988, pp. L1470-L1472.
Trogler, "Photochemical Production of Reactive Organometallics for Synthesis and Catalysis", *ACS Symposium Series*, 307, pp. 177-196 (1986).
Cowan et al., "Syntheses of Photoactive Complexes. Electronic Spectra, Electrochemistry, and SCF-X-DV Calculations for Bis(phosphine)palladium (Dithiooxalato-S,S') . . . ", *Inorg. Chem.*, 1987, 26, pp. 259-265.

(List continued on next page.)

*Primary Examiner*—Roy King
*Attorney, Agent, or Firm*—Scully, Scott, Murphy & Presser

[57] ABSTRACT

The invention is directed to a method for forming a metal coating on a substrate by applying an oxalate of a Group VIII element from the Periodic Table of the Elements to the substrate. The oxalate is selected so that it will decompose to a complex of a zero valent Group VIII element or a Group VIII element on exposure to an energy source. Microelectronic circuits, etch masks or metal contacts on superconductors can be formed by the method when the oxalate coating is exposed to an energy source through a mask or the energy source beamed at the oxalate to trace a pattern on it.

The metal thus obtained can be subsequently coated by electroless compositions especially where the Group VIII element is a catalyst for electroless coatings such as palladium. Additionally, the metal coating may be coated by an electrolytic composition.

Through hole plating can also be achieved by applying the oxalates of a Group VIII element in the through hole of a circuit board followed by exposure to an energy source optionally followed by the application of an electroless and/or electrolytic metal composition.

12 Claims, 1 Drawing Sheet

OTHER PUBLICATIONS

Prignano et al., "Silica-Supported Bis(trialkylphosphine(platinum Oxalates. Photogenerated Catalysts for Hydrosilation of Olefins", *J. Am. Chem. Soc.*, 1987, 109, pp. 3586–3595.

Paonessa et al., "Photochemical Generation of Bis(phosphine)palladium and Bis(phosphine)platinum Equivalents", *Organometallics*, 1985, 4, pp. 647–657.

Wu et al., "Superconductivity at 93 K in a New Mixed-Phase Y-Ba-Cu-O Compound System at Ambient Pressure", *Physical Review Letters*, vol. 58, No. 9, 1987, pp. 908–910.

Laibowitz et al., "Thin Superconducting Oxide Films", *The American Physical Society*, 35, No. 16, 1987, pp. 8821–8823.

Koinuma et al., "Preparation of High-$T_c$ Bi-Sr-Ca-Cu-O Superconducting Thin Films by AC Sputtering", *Japanese Journal of Applied Physics*, vol. 27, No. 3, Mar. 1988, pp. L376–L377.

Bednorz et al., "Possible High $T_c$ Superconducitivity in the Ba-La-Cu-O System", *Z. Phys. B-Condensed Matter*, 64, 189–193 (1986).

Hashimoto et al., "Superconductivity and Substrate Interaction of Screen-Printed Bi-Sr-Ca-Cu-O Films", *Japanese Journal of Applied Physics*, vol. 27, No. 3, Mar. 1988, pp. L384–L386.

Gupta et al., "Laser Writing of Copper Lines from Metal Organic Films", Appl. Phys. Lett. 51(26) Dec. 1987 pp. 2254–2256.

Craighead et al, "Metal Deposition by Electron Beam Exposure of an Organometallic Film", Appl. Phys. Lett. 48(25) Jun. 1986, pp. 1748–1750.

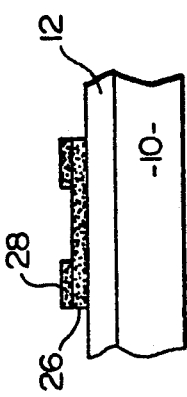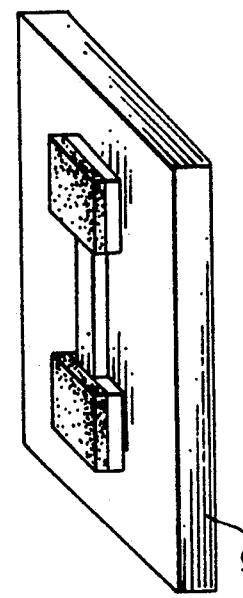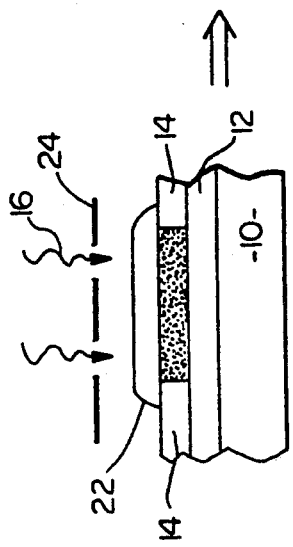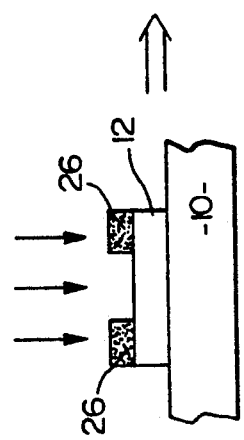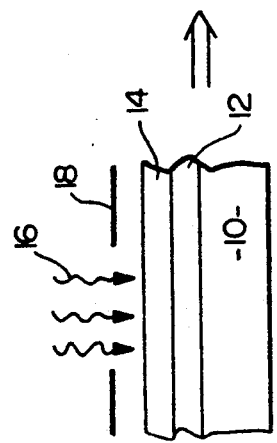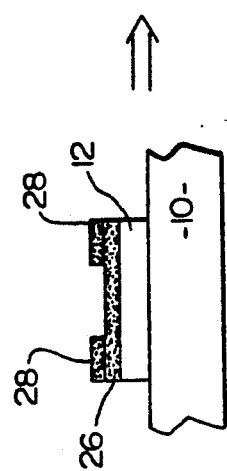

PATTERNED DEPOSITION OF METALS VIA PHOTOCHEMICAL DECOMPOSITION OF METAL-OXALATE COMPLEXES

TECHNICAL FIELD

The technical field to which the present invention relates is the direct formation of a patterned metal coating on a substrate. In another embodiment, the patterned metal coating can be used to catalyze an electroless metal coating, or it can have an electrolytic coating applied to it directly, without first applying an electroless metal coating. High resolution masks and printed circuit boards may be directly prepared in this manner. Through hole plating of the board can also be achieved. Non-metallic substrates may be coated in this manner, including thermoplastic and thermosetting resins as well as glass, ceramics or semiconductor materials based on silicon and the like. Metals and metallic semiconductors can also be coated using this process.

PRIOR ART

Radovsky et al., U.S. Pat. No. 3,099,608 described an improvement in electroplating a dielectric base material by applying what the patentee described as an "conductivator" type metal such as palladium in colloidal or semi-colloidal form. The "conductivator" has the combined function of simultaneously acting as a conductor and a catalyst or activator when placed on a dielectric base for subsequent electroplating, while actually being a thin film composed of particles of colloidal or semicolloidal size metals such as palladium, platinum and the like.

Radovsky et al. noted that the deposition of the extremely thin film of particles of "conductivator" metals on the insulating base had a high electrical resistance due to the character of the film even though the particles making up the film consisted of a conductive metal. Typically, the colloidal metal comprised a suspension containing palladium metal in varying degrees of colloidal form prepared by reducing $PdCl_2$ with $SnCl_2$ in an acid solution. Even with the high resistance of this colloidal palladium material, it was found by the patentees that subsequent direct electroplating over the film of palladium particles could be effected without first applying an electroless coating such as copper.

Strickland et al., U.K. Patent No. 1,222,969 described a plating process for the application of a metal coating to a non-metallic substrate by means of an electro/electroless plating solution. The substrate is immersed in the plating solution until a metal deposit has been formed by an electroless plating process. The substrate is then made cathodic and electroplated from the same plating solution until a deposit is obtained. Strickland et al. discloses that the copper from both steps was deposited as an extremely thin layer i.e. 0.000025 inches.

Peach, U.S. Pat. No. 3,303,111 similarly describes a process and composition for the electro/electroless plating of metal substrates. A relatively small electric current which may be either direct or alternating current is employed to speed up deposition of nickel or nickel/phosphorus alloys on a metal workpiece immersed in a bath containing a nickel salt and a hypophosphite reducing agent such as sodium hypophosphite.

Morrisey et al., U.S. Pat. No. 4,683,036 discloses what has been come to be known in the art as the EE-1 process, however, has not met with commercial success. Morrisey et al. describe a method for electroplating nonmetallic substrates such as circuit board through holes without employing an electroless coating by means of an electroplating bath having a component which causes the plating to preferentially occur at the through holes as compared to plating on the surface of the substrate. The essential components of the Morrisey et al. plating bath include poly(loweralkyleneoxy) surfactants, non-ionic fluorocarbon surfactants or 2,4,6-(2-pyridyl)-S-triazine.

The foregoing process were an attempt to develop a method for coating nonconductive substrates and especially the through holes in circuit boards by a metal conductor without resorting to the use of an electroless coating process. Through holes are used in the circuit board to form an electrical connection between the circuits on the two faces of a single board or the various circuits on the layers of a multilayer board. Elimination of the electroless coating steps could increase the rate of production of these circuit boards with a considerable cost saving. Conventional through hole plating employs electroless copper compositions in which the nonconductive surface of the substrate is contacted with a $SnCl_2$ sensitizer solution followed by a supersensitizer solution of $PdCl_2$. The $SnCl_2$ is oxidized to $SnCl_4$ and the $PdCl_2$ is reduced to zero valent palladium.

A preferred method is to employ an activator comprising colloidal palladium containing stannic tin. Stannic tin forms a protective colloid around the metallic palladium, and the solution implants a precious metal site on the non-conductive surface for the purpose of initiating the deposition of copper by chemical reduction. A post activator is then employed, generally an acid, to solubilize the protective colloid and expose the precious metal, i.e. palladium. This post activator is sometimes referred to as an "accelerator."

The subsequently applied electroless coating solution contains cupric ions and a reducing agent such as formaldehyde, which reduces the cupric ions in the solution to copper metal when in the presence of palladium. The copper metal plates out on the surface of the substrate. When a circuit board is prepared in this way, the surface of the board which has been similarly sensitized by the colloidal palladium is coated as well as the through holes. The electroless copper then is subsequently coated electrolytically.

After the through hole plating process is completed a circuit may be formed on the outer layer of the board. In some instances the outer conductive metal layer of the board is formed as part of the through hole plating process whereas in other instances, the circuit board is a metal clad board. In either event, a print and etch procedure cannot be employed for forming circuits on this layer without plugging any through holes in the board. The print and etch procedure for forming circuits comprises a process in which a positive working photoresist is applied to the metal layer, a positive circuit image projected onto the resist, followed by a developing process to leave a positive resist pattern. The positive resist pattern can also be formed by a negative working photoresist through which a negative circuit image is projected. The board is then etched after which the positive resist is removed. If the recently coated through holes are not plugged in the print and etch process, the etching step will remove the plating applied in the through holes and would be self-defeating.

For this reason, after the through hole plating process is completed, a negative circuit pattern is formed on the surface of the board by means of a negative working photoresist, followed by projecting a positive circuit image onto the resist and developing. This leaves a negative photoresist circuit pattern on the board with bare metal exposed corresponding to the area of the circuit. The negative resist pattern can also be obtained by a positive working photoresist through which a negative circuit image is projected. In commercial operations, the bare metal corresponding to the circuit is then coated by electrolytic means with copper which also builds up the thickness of the copper on the walls of the through hole. This electroplating is followed by electrolytically applying a second metal that acts as an etch-resist. Tin-lead alloys are the most common material used in this respect. The etch-resist coating also coats the metal surface applied to the through holes in the through hole plating process. The photoresist is then removed and the board is etched resulting in the formation of a circuit on the outer layer of the board having a tin lead coating on the circuit as well as on the walls of the through hole.

In any event, it can be appreciated that if a process were available whereby a circuit pattern can be directly applied to a non-conductive substrate without the need either to etch away parts of the circuit or to apply photoresists as part of the etching process, steps can be eliminated, time saved and costs reduced in the production of types of devices directly or where either an electrolytic or an electroless-electrolytic coating method is to be employed.

High resolution dense circuits or micro circuits are presently prepared by a lithographic process which utilizes a lithography mask comprising a quartz substrate having high resolution metal lines or areas provided on the surface.

At the present time, the preferred method of mask fabrication involves a metal lift-off process employing an electron-beam imaging of a resist on a silica substrate, development of the resist to remove unexposed areas and thereby expose the substrate, followed by blanket metal deposition on the exposed substrate and eventual removal of the resist. More recently, the use of direct metal deposition from gas-phase organometallic precursors has been considered for this process.

Additionally, reactive ion etching (RIE) has also been employed to develop circuits on a substrate or form a lithographic mask useful in the manufacture of microcircuits. The RIE process of the prior art conventionally comprised applying a polymer such as a polyimide to a substrate and then coating the polymer with silicon by sputtering a silicon coating on the polymer to a thickness of about 2000Å. The silicon surface is then masked and the unmasked portion exposed to a developer which removes the silicon in the unmasked area. The structure at this point comprises the substrate coated with a continuous polymer having a silicon overlayer which is patterned so part of the continuous polymer coating is available for subsequent reaction through the openings in the silicon coating. This structure is then exposed to an etchant such as an oxygen plasma whereby the is converted to silica by reaction with the oxygen and the oxygen subsequently removes the polymer such as the polyimide in the unprotected areas around the silica. A pattern in cross-section is thus developed which comprises a silica outer layer and a polyimide underlayer adhered to the substrate. The silica is then removed leaving a patterned polymer such as a patterned polyimide on the substrate.

There are, however, various problems associated with this method, the most significant of which is low sensitivity to electron-beams, resulting in extremely slow write speeds which are impractical for high resolution direct mask fabrication. Also, due to the large percentage of hydrocarbon impurity incorporated in the deposited metal, this process has been confined largely to mask repair applications. Presently, there is no direct metal deposition process available for high resolution mask fabrication.

The invention also relates to a method for patterning blanket deposited high transition superconducting films which previously were patterned by photoresist processing to achieve fine line geometries.

High temperature superconductors were first developed by Bendorz and Muller: Z. Phys. B64 (1986) 1989 who reported the superconductivity of oxide compounds in the LaBa-Cu-O system. This lead to the subsequent discovery of high temperature superconductivity (above 90K) in the Y-Ba-Cu-O system by Wu, et al., Phys. Rev. Lett. 58 (1987) 908. Superconducting films can be manufactured by reactive evaporation, R. Laibowitz et al., Phys. Rev. (B) 35, 8821 (1987), ac sputtering, Koinuma et al. Jpn. J. Appl. Phys. 27 (1988) L376, rf sputtering, Nakao et al., Jpn. J. Appl Phys. 27 (1988) L. 378, screen-printing, Hashimoto, et al. Jpn. J. Apply. Phys. 27 (1988) L. 384, or employing a liquid phase epitaxial (LPE) technique Liu, et al. Jpn. J. Appl. Phys. 27 (1988) L1470. The foregoing references are incorporated herein by reference as well as the various references cited therein.

The prior art teaches utilization of patterned photoresist stencils to serve as etch masks to pattern superconductor films and to delineate contact metallurgy on the patterned film. The process of developing an exposed photoresist film requires that the superconducting film and the resist be submerged in a development solution which contains potassium hydroxide. Exposure to the potassium hydroxide solution causes a large degradation of the transition temperature, or renders the material nonsuperconducting so it is a process step to be avoided to ensure retention of the transition temperature of the film in the final device.

Accordingly, it would be advantageous to provide a composition and a method having increased sensitivity to achieve the final mask product. The disadvantage of using the prior art electron-beam decomposition processes is that the organometallic compositions employed were deposited as monolayers as in the case of gas-phase adsorption. The resolution and clarity of any pattern, however, would be improved if more than one layer is deposited. It therefore would be desirable to provide a method and a composition whereby instead of monolayers being utilized, thousands or tens of thousands of monolayers could be made available to thereby improve the resolution and clarity of the image. Additionally, by providing thousands or tens of thousands of monolayers for forming this type of mask, opaqueness can be achieved using thinner metal films, which translates ultimately to a greater degree of resolution. The organometallic of the prior art left organic impurities in the deposited layer, whereas if the metal layer deposited were a high purity metal, it would enhance the resolution and clarity of the image.

It would also be highly desirable to provide a composition and a method for direct microcircuit fabrication on suitable dielectric substrates without having to employ the multi-step processes of the prior art which, as noted before, increase the time and therefore the cost of manufacturing such circuits.

It also would be of some advantage to provide a process for providing etch masks to pattern superconductors and/or provide a patterned film and especially a metal film on superconductors especially superconductor films wherein the process would be free of the disadvantages of using a photoresist film that requires development with a material that contaminates the film such as a developer which comprises or contains an alkali material such as an alkali metal hydroxide and specifically potassium hydroxide.

Photoactive complexes that will decompose in the presence of light to form zero valent metal complexes or metals are known, however the utilization of these complexes to form patterned metal coatings is not disclosed.

The syntheses and reaction of photoactive complexes of Group VIII oxalates (including dithiooxalates) is described for example, by Drogler, *A.C.S. Symposium Series* Vol. 307, 177–96 (1986); Cowan et al. *Inorg. Chem.* Vol. 26, pp. 259–65 (1987); Prignano et al. *J. Am. Chem. Soc.* Vol. 109, pp. 3586–95 (1987) and Paonessa et al. *Organometallics* Vol. 4, pp. 647–57 (1985).

Accordingly, it is an object of the present invention to overcome these and other difficulties encountered in the prior art.

It is a further object of the present invention to provide a method and composition for the application of patterned metals (including zero valent metals) on a substrate.

It is a further object of the present invention to provide a method for applying patterned metals (including zero valent metals) to a substrate by exposing a precursor of said metals to an energy source sufficient to convert such precursors to said metals.

It is a further object of the present invention to provide a method for selectively applying metals (including zero valent metals) to a substrate by selectively exposing a precursor of said metals to radiant energy sufficient to convert such precursors to said metals.

It is a further object of the invention to employ such processes in mask fabrication or microcircuitry.

It is also an object of the invention to employ such process for applying a patterned metal (including a zero valent metal) to a substrate so that said metal can be either coated electrolytically or serve as a catalytic coating for depositing an electroless metal coating.

It is also an object of the present invention to provide a photoresist material and process for a superconductor and especially a superconductor film that after applied to such a superconductor can be developed without adversely affecting the superconductor material beneath it.

It is also an object of the present invention to provide a composition and a method for applying a patterned metal film on a superconductor such as a superconducting film where such composition is photosensitive and can be developed with materials that will not adversely affect the superconducting material.

It is a further object of the present invention to provide such novel photoresist compositions and methods for providing etch masks to pattern a superconductor such as a superconductor film or to delineate contact metallurgy as a patterned film on the surface of such a superconductor where the compositions after exposure can be developed with materials other than alkali materials such as alkali hydroxides and especially potassium hydroxide.

These and other objects have been achieved according to the present invention which will become apparent by reference to the written description, drawings and claims that follow.

SUMMARY OF THE INVENTION

The present invention relates to a method of forming a patterned metal coating on a substrate comprising applying an oxalate of a Group VIII element selected from the Periodic Table of the Elements on this substrate. The oxalate is selected so that it will decompose to a complex of a zero valent Group VIII element or a Group VIII element on exposure to an energy source.

The oxalate coating is exposed to an energy source through a mask or the energy source beamed at the oxalate coating to trace a pattern on it, the pattern being either the complex of a zero valent Group VIII element or a Group VIII element which can optionally be coated by electrolytic or electroless compositions.

BRIEF DESCRIPTION OF THE DRAWINGS

FIGS. 1(*a*), 1(*b*), 1(*c*), 1(*d*), 1(*e*) and 1(*f*) are steps for achieving metal contacts on a superconducting film according to one embodiment of the present invention.

DETAILED DESCRIPTION OF THE INVENTION

The present invention relates to the patterned deposition of metals by the decomposition of metal-oxalate complexes by an energy source and especially light or ion beam energy. The metal-oxalates are generally based on the Group VIII metal elements, the oxalates of which when exposed to an energy source will decompose either to a zero valent metal complex or a metallic element. The oxalates include conventional oxalates as well as thiooxalates and may be broadly described as chalcogen oxalates where the chalcogens are oxygen, sulfur, selenium or tellurium. This deposition is also accomplished by using a mixture of two or more oxalates, or by applying two or more layers of the oxalates described and defined herein.

The patterned deposition of the metals is obtained by any of several exposure methods known in the art such as by exposing the oxalate to an energy source through a mask or by employing an energy beam such as an ion beam and tracing a pattern on the oxalate after the oxalate has been applied to a substrate.

For the purpose of the present invention it is intended to include both a complex of a zero valent Group VIII element or a Group VIII element when referring to "metals" that are deposited from the oxalate. Once the metals are deposited, they may be optionally coated by an electroless or an electrolytic metal coating both of which are known in the art. Electroless metal coatings have been described above whereas electrolytic coatings are those that may be applied by inserting the patterned metal obtained according to the process of the present invention in an electrolytic bath such as a copper sulfate electrolytic bath, attaching a cathode to the patterned metal and contacting the bath with an anode where both the cathode and anode are connected to a power source.

Some of the preferred electroless and electrolytic coatings that are applied to the metals deposited from the oxalates are copper and nickel electroless coatings (as well as alloys of each) and copper, gold, silver and cobalt electrolytic coatings (as well as alloys of each).

Additionally, the patterned metal obtained according to the present invention deposits as a high purity metal as compared to the gas phase organometallics employed in forming electron-beam images, since these organometallics generally left a significant amount or organic impurities in the film during the deposition process. The advantage of using the metal oxalates according to the method of the present invention is that they liberate primarily $CO_2$ gas as the major product of decomposition. Where ligands are employed to stabilize the oxalates of the present invention, they should be selected so as to minimize the amount of organic impurities in the patterned metal layer that is employed for this aspect of the invention. By way of illustration, where it is desirable to minimize the organic impurity residues, the metal oxalate starting material if stabilized with ligands, would contain diphosphine ligands. This would also be the case where the metal oxalates of the present invention are used for direct microcircuit fabrication and it is desirable to minimize organic impurities in the patterned metal coating formed.

Although the present invention does not require the use of a resist layer, it can be used in conjunction with such resists. Many resist and polymers that can be patterned work on the principle of development by means of selective solubility of exposed versus unexposed regions. In many cases this hydrophobic/hydrophilic behavior is derived from acid moieties contained within and on the surface of the resist. Resist exposure followed by dipping in a solution of the metal-oxalate results in the deposition of metal on the resist in those regions containing acid functionalities. This may then be used for subsequent electroless or electrolytic plating or as a barrier for dry pattern transfer via reactive ion etching (RIE). Thus, another aspect of the invention is the acid catalyzed decomposition of these metaloxalate complexes.

The metal-oxalate complexes of the present invention also include those complexes in which the Group VIII element is further associated with a ligand based on a Group VA element of the Periodic Table of the Elements or sulfur. It has been found that these ligands can be selected to improve the stability of the metal-oxalate complexes and/or their reactivity, vapor pressure, solvent solubility or sensitivity to energy such as light energy and the like.

For example, even though Pd(II)(oxalate) has been made and used in the method of the present invention, it is unstable towards spontaneous decomposition, whether as a solid or in solution at ambient (room) conditions. It has been discovered, however, that the corresponding bisphosphine derivatives are far more stable towards decomposition and therefore offer advantages, one of which is the improved storage stability.

Generally, the metal oxalates used according to the present invention have the formula:

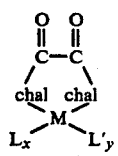

where M is a Group VIII element.

In one embodiment of the invention the metal M is a noble Group VIII element i.e. platinum, palladium, osmium, rhodium, ruthenium and iridium, the noble Group VIII elements being especially suitable where the patterned metal is employed to catalyze a subsequently applied electroless coating.

The ligands are designated as L and L' and are the same or different and are based on Group VA elements or sulfur by which it is intended that the Group VA elements or sulfur are organosubstituted or substituted with hydrogen. Additionally, the ligands L and L' when taken together may form a heterocyclic structure based on an organo substituted Group VA element. The ligands L and L' may also comprise a polymer bound ligand.

In the above formula x and y are 0 or 1 so that the sum of x and y does not equal 1 and "chal" is a chalcogen i.e. oxygen, sulfur, selenium or tellurium. The preferred chalcogens are oxygen or sulfur so that the preferred metal-oxalate compounds of the present invention are metal-oxalates based on oxalic acid or metal oxalates based on thiooxalic acid.

The polymer bound ligands that may be employed according to the invention as co-polymers of

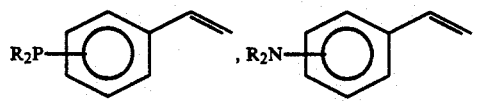

with ethylenically unsaturated monomers such as styrene, vinyl acetate, vinyl chloride, acrylic and methacrylic acids, esters and amides and the like or other polymers containing an $R_2P$- or $R_2N$- group, all of which are known in the art. In the foregoing, the radical R is subsequently defined. These ligands may be contained in a preformed polymerized after chelation.

The ligands L and L' more specifically comprise:
$NR_3$
$RCN$
$PR'_3$
$AsR'_3$
$SbR'_3$
$BiR'_3$
$R_2S$
bis(dicyclophosphino)lower alkane
bis(diloweralkyl phosphino)lower alkane
$S_2Pd_2[P(CH_3)_3]_4$
trialkoxysilyl loweralkyl phosphine; where
R and R' may be the same or different;
R is an alkyl or cyclic radical wherein said cyclic radicals are saturated cycloaliphatic, unsaturated cycloaliphatic, aromatic and the lower alkyl and lower alkylene substitute cyclic radicals;
and wherein R' is hydrogen or R.

Where the radical R above is an alkyl radical it may comprise an alkyl group having up to about 8 carbon atoms including the straight chain as well as branched chain configurations thereof e.g. methyl, ethyl, propyl, isopropyl, butyl, t-butyl, i-butyl n-octyl and the like. The various cyclic radicals comprising cycloaliphatic, unsaturated cycloaliphatic and aromatic radicals have from about three up to about 10 carbon atoms and include cyclopropyl, cyclobutyl, cyclopentyl, cyclohexenyl, cyclooctanyl, cyclooctadienyl, methylcyclohexenyl and methylcyclooctadienyl and the like. The various aromatic radicals include phenyl, xylyl, tolyl and napthyl radicals and the like.

Examples of the various ligands $NR_3$ include trimethylamine, triethylamine, triphenylamine and the like.

The various ligands L and L' comprising RCN include acetonitrile, propionitrile, butyronitrile, benzonitrile, isophthalonitrile; 2-methylglutaronitrile; 2-pentenenitrile; 3-pentenenitrile; 2,2'-azobis(isobutyronitrile); 2,2'-azobis(2,4-dimethylvaleronitrile) and the like. The latter two nitriles are free radical donors and are generally known to decompose on heating to form two free radicals with the liberation of nitrogen, the decomposition being controlled by regulating temperature.

Ligands such as the foregoing nitriles that volatilize can be removed from the surface from which the volatile materials are generated by further heating and/or the application of a vacuum or by purging with an inert gas stream such as nitrogen and the like. Where free radicals are generated such as in the case of the aforementioned nitriles, prior to exposure, the oxalate containing the aforesaid nitrile ligands can be contacted with a monomeric substance that polymerizes in the presence of free radicals such as room temperature liquid monomers or polymeric materials containing unreacted monomeric materials that will polymerize upon the exposure to the free radicals generated as the result of the decomposition of the aforementioned nitriles into free radicals.

The ligands L and L', as noted before, may also comprise a polymer bound ligand where the oxalate is combined with a standard resist polymer based on styrene which can be cross-linked with the palladium oxalate of the present invention. Since the metal oxalates of the present invention include those oxalates having bidendate ligands, the combination of the oxalates with polymers wherein the polymers will comprise the ligands L and L', the oxalate will act as a cross-linking material and reduce the solubility of the polymer. One of the advantages of such a combination is that the metal oxalates with such polymeric ligands can be built to film thicknesses greater than the approximate 400Å thickness which is the average dry film thickness of the metal oxalate films produced according to the invention. Azodicarbonamide ligands are also suitable.

The ligands L and L' of the formula $PR'_3$ include phosphine; trimethylphosphine; triethylphosphine; tri-n-butylphosphine; triphenylphosphine; n-octyl phosphine; triisopropyl phosphine; tricyclohexyl phosphine; dimethylphenyl phosphine; diphenylmethyl phosphine and the like.

The ligands L and L' of the formula $AsR'_3$ include arsine; triphenylarsine, trimethylarsine; dimethylphenylarsine; diphenylmethylarsine and the like.

The ligands L and L' of the formula $SbR'_3$ include -triphenyl stibine; diphenylnaphthylstibine; trimethylstibine; triethylstibine; diphenylmethylstibine; or trimethylene bis(diphenylstibine) and the like. The antimony-metal bond in trialkyl-and triarylstibines is weaker than in the compounds formed from tertiary phosphines or arsines and for this reason the stibines have not been used as extensively as ligands as the phosphines or the arsines.

The ligands of the formula $BiR'_3$ are of a lower order of thermal stability than the corresponding phosphorus, arsenic or antimony compounds. Accordingly, for practical purposes, these ligands include triphenyl bismuthine, alpha-naphthyl-biphenylbismuthine and the like. Generally, the trialkyl-bismuthines are colorless liquids that fume in air such as triethylbismuthine or trimethylbismuthine.

Ligands of the formula $R_2S$ generally comprise diethylsulfide and similar di-lower alkyl sulfides.

Ligands designated as (diarylphosphino)loweralkanes generally comprise 1, 2-bis(diphenyl phosphino)ethane referred to as dppe whereas the (di-loweralkyl phosphino)loweralkanes generally comprise 1,2-bis(diethyl phosphino)ethane generally referred to as depe. These compounds generally represent the ligands L and L' taken together as a heterocyclic structure wherein one mole of these compounds will coordinate with one mole of the metaloxalate.

The ligand $S_2Pd_2[P(CH_3)_3]_4$ is more fully described and illustrated in Cowan et al. (supra) and is designated as a (1,1-thithiooxalato-S,S')bis($\mu_3$-sulfido)-2,2,3,3-tetrakis-(trimethylphosphine)-triangulo-radical.

The ligands having the formula of triloweralkoxysilyl loweralkyl phosphine generally comprise (trimethoxysilyl)ethyl or (triethoxysilyl)octyl radicals and the like such as for example 2-(trimethoxysilyl)ethyl-phosphine or 8-(triethoxysilyl) octylphosphine.

Again the Group VIII metals that are employed in the metal-oxalate compounds are those that when the metal-oxalate complex is exposed to energy are converted to a complex of a zero valent Group VIII element or a Group VIII element, the preferred metals being nickel, palladium or platinum. It is noted in this respect that the thermal and photochemical sensitivity of the dithiooxalate complexes of these metals decrease in the sequence Ni>Pd>Pt. For example, the platinum complexes can be boiled in DMF for days without decomposition while the palladium and nickel complexes decompose within minutes when boiled. Further, the nickel complexes of oxalic acid are difficult to prepare, presumably because of the instability of bis-(phosphine) nickel oxalates and accordingly in some instances it is preferred to prepare the metal complexes based on thiooxalic acid.

The specific Group VIII metal that is selected will also depend on whether an electrolytic or electroless coating is to be subsequently applied to the substrate. Electroless coatings are generally catalyzed by the Group VIII noble metals such as platinum or palladium and accordingly the metal-oxalate complex is selected so that upon exposure to an energy source either a zero valent or a metallic noble Group VIII metal is obtained e.g. palladium or platinum. Direct electrolytic plating (i.e. plating the substrate thus prepared with the exposed metal-oxalate complex) can also be effected in a manner similar to Radovsky et al.

Some specific metal-oxalate complexes that may be used according to the present invention comprise:

$Pd(II)(C_2O_4)(CH_3CN)_2$
$Pt(C_2O_4)(PEt_3)_2$
$Pd(C_2O_4)(PEt_3)_2$
$Pt(C_2O_4)(PPH_3)_2$
$Pd(C_2O_4)(PPh_3)_2$
$Pt(C_2O_4)(SEt_2)_2$
$Pt(C_2O_4)(PMe_3)_2$
$Pd(C_2O_4)(PMe_3)_2$
$Pt(C_2O_4)[P(n-Bu)_3]_2$
$Pt(C_2O_4)(SEt_2)[P(i-Pr)_3]$
$Pt(C_2O_4)(SEt_2)[P(c-Hx)_3]$
$Pd(C_2O_4)(PH_3)_2$
$Pd(C_2O_4)[P(n-Bu)_3]_2$
$Pt(C_2O_4)(SEt_2)(PEt_3)$
$Pt(C_2O_4)(SEt_2)(PPh_3)$ $Ni(S_2C_2O_2)(PMe_3)_2$
$Ni(S_2C_2O_4)(depe)$
$Ni(S_2C_wO_4)(dppe)$
$Pt(C_2O_4)-[(OMe)_3Si(CH_2)_2PEt_2]_2$
$Pt(C_2O_4)-[(OEt)_3Si(CH_2)_8PEt_2]_2$
(1,1-Dithiooxalato-S,S')bis($\mu_3$-sulfido)-2,2-3,3-tetrakis(trimethylphosphine)-triangulotripalladium-(II):

where

Me is methyl, Et is ethyl, Pr is propyl, Bu is butyl, C-Hx is cyclohexyl, Ph is henyl, $C_2O_4$ is oxalate, $S_2C_2O_4$ is thiooxalate and depe and dppe have been defined previously.

Other oxalates that might be used include copper oxalate or copper thiooxalate and analogous Group IB oxalates and thiooxalates.

The various substrates that may be coated according to the present invention include non-metallic substrates, as well as metallic substrates. The non-metallic substrates include not only polymer materials but also ceramic compositions, glass compositions and non-metallic semiconductor materials based on silicon.

The polymeric materials that may be coated generally comprise those used in the formation of circuit boards such as the thermosetting materials such as phenolic resins and the art known equivalents thereof and cross-linked epoxy resins generally reinforced with a fibrous material such as glass fibers, synthetic resin fibers such as Kevlar (Trademark) materials and paper or other non-woven fabrics as well as woven fabrics. Flexible circuit boards that may be coated include those based on thermoplastic materials such as fluorocarbon polymers, nylon polymers, polyimides, polyparabanic acid polymers and polyester polymers generally based on condensation products of phthalic acid, maleic acid and polyols such as the various glycols and other polyhydroxy alcohols which are used in polyester synthesis. These polyesters are subsequently cross-linked through the maleic ester group by means of styrene, divinyl benzene and the various are known equivalents thereof. Substrates that may be coated according to the method of the present invention include semiconductor grade elements or compositions such as gallium, gallium arsenide, germanium and silicon and the like.

Since the metal oxalates can contain Group VA ligands and the substrate can comprise either metallic [e.g. gallium or germanium] and nonmetallic [e.g. silicon] semiconductor materials, the oxalates containing a Group VA ligand [e.g. arsenic] could be used not only to form a metal coating on the semiconductor material substrate but also to provide some doping effect whether the substrate is undoped and in some instances comprises a doped substrate. After coating with the oxalates of the invention, these substrates would be heated to promote the doping affect afforded by the coating; typically, one hour at 600° C. for silicon and slightly lower temperatures for germanium.

Conventional metals may also be coated according to the present invention such as copper and nickel, and generally those in the fourth period of the Periodic Table of Elements e.g. titanium, vanadium, chromium, manganese, iron, cobalt, nickel, copper, zinc and the various alloys thereof as well as aluminum and magnesium and the art known alloys thereof. Coatings formed on these metals and alloys according to the method of the present invention can be used either for decorative purposes or for lithographic printing plates and the like.

As noted previously, one of the problems of the prior art processes for the manufacture of circuit boards is the coating of through holes in the circuit boards, the coating process being a multistep operation in the commercial manufacture of the boards. According to the present invention, through holes in a circuit board can be coated with a metal film directly by employing the process of the invention to a circuit board or multilayer board that has a circuit or circuits applied to the outer layer or layers of the board or boards or multilayer boards which do not have circuits yet formed on them. In the former case, the circuit or circuits can be masked using a conventional masking operation known in the art whereby the holes are unmasked and the oxalates of the present invention applied to the uncoated through holes and developed by exposing the coating thus applied to radiation as described herein. Additionally, radiation can be applied to the unexposed coating by means of fiber optical leads inserted into the through holes and withdrawn at a rate sufficient so that the end of the fiber exposes the walls of the coated through hole to radiation as it is withdrawn.

Additionally, the process of the invention can be applied to the formation of zero valent or metal circuits from the oxalates of the invention as well as in the through holes of unclad boards or boards without circuits or only containing partial circuit formation. In either event (i.e. whether coating through holes or forming coated through holes and/or circuits) the oxalate coatings that are developed are optionally coated either with an electroless or an electrolytic metal coating or both e.g. copper and the like as previously noted herein.

The process of the invention also is employed in the RIE process and is superior to utilizing a silicon etch barrier in the process. In order to obtain adequate etch barrier properties, the silicon coating in the RIE process is coated to a thickness of about 2,000Å whereas employing the oxalates of the present invention such as the palladium oxalates, optical opaqueness is obtained at slightly greater than 240Å thickness to about 400Å and higher image resolution is obtained than with the silicon etch barrier. Additionally, some of the problems with sputter coating of the silicon are also avoided when using the oxalates of the present invention especially the palladium oxalates.

As an example of the RIE method employing the coatings of the present invention, a substrate is coated with a polymer such as a polyimide and a palladium oxalate material as described herein is coated over the polymer and exposed to light through a mask. The light converts the palladium oxalate to zero valent palladium leaving the unexposed palladium oxalate in an unreacted state and is readily removed by a solvent. The structure obtained thus comprises a zero valent palladium pattern on a continuous coating of a polymer such as a polyimide on a substrate. The structure in turn is then exposed to an oxygen plasma by which the palladium is converted to palladium oxide, the oxygen plasma reacting with the exposed polymer and removing it down to the substrate. The palladium oxide is then removed leaving a polyimide pattern on the substrate.

The following examples are illustrative.

EXAMPLE 1

A metal oxalate $Pd(II)(oxalate)(CH_3CN)_2$ was dissolved in methanol and spun onto a dielectric substrate comprising silicon. The methanol solvent is removed by baking on a standard hot plate or in an oven. After subsequent photolysis for five minutes through a standard contact test mask using the output from an unfiltered Xe-Hg arc lamp, post-exposure baking (optional) and rinsing with a suitable solvent images are obtained having line sizes down to a resolution of 1.4 microns. These images may be coated with conventional electrolytic or electroless plating solutions.

EXAMPLE 2

A photoresist is exposed through a mask and developed to obtain a patterned resist having carboxyl groups.

The photoresist employed comprises a product designated AZ-1300 series (AZ is a trademark of the Azoplate Division of American Hoechst Corporation) although other comparable photoresist can be employed such as AZ-1400 series, AZ-2400 series and AZ-4000 series.

Other photoresist that may also be employed comprise Micro Positive Resist 809 supplied by Eastman Kodak; Waycoat HPR 204/206 or Waycoat MPR Resist both supplied by Phillip A. Hunt; Iso Fine Positive Resist supplied by Micro Image Technology; OFPR-77 or OFPR-800 both of which are supplied by Tokyo Ohka Company.

The metal oxalate solution of Example 1 is spun onto the patterned resist and the solvent removed by drying in a conventional manner. The carboxyl groups in and on the resist promote the acid catalyzed decomposition of the metal oxalate into zero valent palladium or palladium metal in those regions containing the acid functionalities. The metal thus deposited is used as in Example 1 for subsequent electrolytic or electroless plating or as a barrier for dry pattern transfer via reactive ion etching.

The dry pattern transfer process consists of spin coating a substrate with a photoresist, and exposing the photoresist through a mask with UV radiation. The resist is developed leaving behind a pattern where the mask did not allow exposure. The resist mask acts as a secondary mask for reactive ion etching (RIE) which comprises utilizing both chemical and physical sputtering. The reactivity of the ions that are formed is very high especially when chemical sputtering occurs. Using carbon tetrafluoride as an example, reactive ions of fluorine which have a negative charge and trifluoromethane which has a positive charge as formed in an electric field at low pressure. These ions are accelerated and directed to the substrate where they displace atoms through two processes (1) physical displacement, and (2) chemical reactions forming volatile by-products. The etching process is anisotropic. Generally, the resist stencil or mask is etched at a slower rate than the underlying film thus allowing a pattern transfer.

EXAMPLE 3

The metal-oxalate complex of Example 1 is spun onto a non-metallic substrate followed by solvent removal by baking on a standard hotplate or in an oven. The film obtained is exposed to an electron-beam, post-exposure baking (optional) and rinsed with a suitable solvent to obtain a patterned metal. This patterned metal is then used as a high resolution lithographic mask or for direct microcircuit fabrication.

The patterning of metal-oxalate film with an electron beam is carried out in any electron beam lithography system. In an electron beam lithography system, the electron beam column is under computer control such that the focused electron probe can be vector positioned over the sample surface for pattern exposure in the metal-oxalate film. The electron beam energy used is in the range of 10 to 30 keV. The electron probe size typically used is $\simeq$ 10 to 25 nm in diameter. The corresponding beam current used is $\simeq$ 100 pA. For the exposure of metal-oxalate complex, the required beam dose used is $\simeq$ 5 $\mu$C/sq cm. Pattern resolution below 0.1 $\mu$m can be achieved with this level of beam dose.

In the fabrication of a high resolution lithographic optical mask, the metal oxalate film is first spun on a blank optical quartz mask with the appropriate film thickness. Then the coated quartz substrate is introduced into the chamber of the electron beam lithography system where the appropriate mask patterns are exposed directly in the metal-oxalate film with the focused electron probe. The exposed regions of the metal-oxalate film are converted to zero valent Pd upon electron beam irradiation. Thus by developing the exposed quartz substrate in an appropriate solvent such as MeOH for $\simeq$ 30 seconds to remove the unexposed metal-oxalate film, a high resolution Pd metal mask pattern is obtained on the quartz substrate.

EXAMPLE 4

The method of Example 3 was repeated however, the electron-beam exposure carried out to form a patterned metal coating on the substrate in the configuration of a microcircuit. After optional post-exposure baking and rinsing with a suitable solvent, a microcircuit is obtained by means of this electron-beam patterning.

EXAMPLE 5

The following example describes a technique that allows for fine line patterning of a superconductor film which eliminates the use of patterned photoresist stencils as etch masks developed by a solution which contains potassium hydroxide.

A solution of a palladium (II) oxalate (L)$_2$ complex [where L=CH$_3$CN,P(CH$_3$)$_3$ or P(C$_6$H$_5$)$_3$] is spin coated onto a blanket deposited superconducting film followed by exposure to ultraviolet radiation and subsequent development in methyl alcohol. The film is then air baked at 200° C. for 100 seconds, reducing the palladium oxalate to a highly conductive metallic film of palladium(O).

By employing this process, metal contacts can be formed on a superconducting film 12 formed on a conventional substrate 10 as illustrated in FIG. 1 where at (a) the palladium complex 14 is spin coated onto a blanket deposited superconducting film 12 followed by exposure to UV-radiation 16 through mask 18 and developed in methyl alcohol. This step reduces the palladium complex to palladium black 20, which in (b) creates an image in the layer, and is used for alignment of the second coating 22 of palladium, which is exposed through mask 24 and developed as above. The device is then air baked at 200° C. for 100 seconds, (c), followed by converting the palladium black to palladium metal layer 26. The patterned superconductor is then chemically etched in for example, dilute hydrochloric acid, using the metallic palladium film as an etch mask as shown by (d). The device is next ion etched (e) to remove the second level of palladium metal 28 down to the first palladium metal layer 26 and the uncoated layer 26 down to the superconducting film interface (e) leaving the first level of palladium 26 over contact pads to form the metal contacts (f). The oxide superconductor has a very low ion etch rate relative to the palladium film and good etch control is therefore possible.

The invention is also directed to a process in which the photoresponse of a Pd (oxalate) $(L)_2$ complex [where $L=CH_3CN$] is tailored by modifying the ancilary ligands, L, associated with the complex which allows for unique fabrication of superconducting films with both fine lines and broad area electrical contacts.

Although in the foregoing examples the metal-oxalate complex is exposed either to light energy (the output from an unfiltered Xe-Hg arc lamp) or an electron-beam, similar results can be obtained with energy sources such as laser light, ion beam, visible U.V., heat, and the like.

Other metal oxalate complexes, as described herein, can be employed and their selection will depend on the type of substrate to which they are applied, the end use e.g. coating by electroless or electrolytic means or by deposition of patterned metal microcircuits, high resolution lithographic masks and the energy source which is optimum for the application. The various ligands that are optionally a part of the metal-oxalate complex will also be selected to take into account various processing conditions such as vapor pressure, solvent solubility and sensitivity to various types of energy that the complexes are exposed to. Accordingly, this enables these complexes to be tailored for use in a variety of microelectronic processes.

Although the invention has been described by reference to certain compounds and methods for forming a metal pattern on a substrate from an oxalate of a Group VIII element, it is not intended that the novel process be limited thereby but that certain modifications are intended as falling within the spirit and scope of the foregoing disclosure and claims.

Having thus described our invention, what we claim as new, and desired to secure by letters patent is:

1. A method of forming a metal pattern on a substrate comprising applying an oxalate of a Group VIII element on said substrate that can be decomposed to a complex of a zero valent Group VIII element or a Group VIII element on exposure to an energy source, and exposing a portion of said oxalate to said energy source in a pattern to obtain a zero valent Group VIII metal in a pattern on said substrate, where said oxalate has the formula:

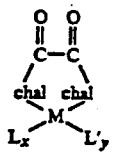

where M is Ni, Pd or Pt;
chal is oxygen or sulfur; and
wherein $L_x$ and $L_y$ are the same or different, and each is a polymer ligand; X and Y are one.

2. The method of claim 1 where said polymer ligand is selected from a homopolymer of dialkyl phosphino, dialkyl nitrogen substituted styrenes or copolymers thereof with an ethylenically unsaturated monomer.

3. The method of claim 1 further comprising the application of a polymer photo resist to said substrate, said polymer photo resist containing free carboxyl groups, after which said oxalate is applied to said polymer photo resist whereby decomposition of said oxalate is catalyzed by said carboxyl groups to form said zero valent Group FIII metal.

4. The method of claim 3 where said polymer photoresist is exposed to a light to obtain a patterned polymer photoresist after which said oxalate is applied to said exposed polymer photoresist whereby said oxalate is decomposed by said carboxyl groups.

5. The method of claim 1 wherein said substrate is selected from the group consisting of a nonconductive, semiconductive conductive and superconductive material.

6. The method of claim 1 further comprising coating said patterned metal with an electroless or an electrolytic composition.

7. The method of claim 5 further comprising coating said patterned metal with an electroless or an electrolytic composition.

8. The method of claim 5 where said substrate is a high Tc superconductor and said oxalate is a palladium oxalate so that a zero valent palladium pattern is obtained on said high Tc superconductor.

9. A method of coating a circuit board with a metal coating comprising applying an oxalate of a Group VIII element on said board wherein said oxalate can be decomposed to a complex of a zero valent Group VIII element or a Group VIII element on exposure to an energy source, and exposing a portion of said oxalate to said energy source to obtain a zero valent Group VIII metal coating on said board wherein said coating comprises a circuit pattern or a coated through hole or both a circuit pattern and a coated through hole on said board, where said oxalate has the formula:

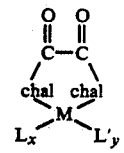

where M is Ni, Pd or Pt;
chal is oxygen or sulfur; and
wherein $L_x$ and $L_y$ are the same or different, and each is a polymer ligand; X and Y are one.

10. The method of claim 9 where said polymer ligand is selected from a homopolymer of dialkyl phosphino or dialkylnitrogen substituted styrenes of copolymers thereof with an ethylenically unsaturated monomer.

11. The method of claim 9 further comprising applying an electroless or an electrolytic composition to said metal coating.

12. The method of claim 11 where said metal coating is a catalyst for an electroless composition.

* * * * *